United States Patent
Mahorowala et al.

(10) Patent No.: US 6,869,899 B2
(45) Date of Patent: Mar. 22, 2005

(54) LATERAL-ONLY PHOTORESIST TRIMMING FOR SUB-80 NM GATE STACK

(75) Inventors: Arpan P. Mahorowala, Bronxville, NY (US); Maheswaran Surendra, Croton-on-Hudson, NY (US); Jung H. Yoon, Poughkeepsie, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 09/902,727

(22) Filed: Jul. 12, 2001

(65) Prior Publication Data

US 2003/0017711 A1 Jan. 23, 2003

(51) Int. Cl.$^7$ ............................................. H01L 21/00
(52) U.S. Cl. ..................... 438/950; 438/949; 438/947; 438/945
(58) Field of Search ................. 438/950, 949, 438/947, 945, 948, 942, 719, 710, 587

(56) References Cited

U.S. PATENT DOCUMENTS 5,985,524 A   11/1999  Allen et al.
6,420,097 B1 * 7/2002  Pike et al. .................. 430/313
2002/0160320 A1 * 10/2002 Shields et al. .............. 430/328

OTHER PUBLICATIONS

*A High Resolution 248 nm Bilayer Resist*, Qinghuang Lin, et al., Part of the SPIE Conference on Advances in Resist Technology and Processing XVI; SPIE Vo. 3678; Santa Clara, CA (Mar. 1999).

*Lateral–only Photoresist Trimming for sub–80 nm Gate Stack Definition*; Arpan P. Mahorowala; IBM (Jun., 2000).

*Low Temperature Etching of Silylated Resist in an Oxygen Plasma Generated by an Electron Cyclotron Resonance Source*; K.T. Sung; J. Electrochem. Soc., vol. 140, No. 12 (Dec. 1993).

* cited by examiner

Primary Examiner—Maria F. Guerrero
Assistant Examiner—Christy Novacek
(74) Attorney, Agent, or Firm—Connolly Bove Lodge & Hutz LLP; Daniel P. Morris, Esq.

(57) ABSTRACT

The invention relates generally to lithographic patterning of very small features. In particular, the invention relates generally to patterning of semiconductor circuit features smaller than lithographically defined using either conventional optical lithography or next generation lithography techniques. The invention relates more particularly, but not by way of limitation, to lateral trimming of photoresist images.

28 Claims, 4 Drawing Sheets

LATERAL-ONLY PHOTORESIST TRIMMING FOR SUB-80 NM GATE STACK

FIELD OF THE INVENTION

The invention relates generally to lithographic patterning of very small features. In particular, the invention relates generally to patterning of features smaller than lithographically-defined using either conventional optical lithography or next generation lithographic techniques such as e-beam, euv, or x-ray. The invention relates more particularly, but not by way of limitation, to lateral trimming of photoresist (PR) images.

BACKGROUND

The rapid shrinking of gate dimensions of CMOS devices has led the gate line width down to the sub-100 nm regime. For example, the physical line width of the polysilicon gate required for IBM's CMOS 9S technology generation is about 90 nanometers. From a lithography process standpoint, current capabilities with 248 nanometer DUV systems, in conjunction with phase shift mask technology and a single layer resist with thickness of about 450 nanometers, are limited to about 120 nanometers. The resist thickness is limited by the shrinking depth of focus needed to resolve the smaller features. FIG. 1 illustrates the situation, where the post-lithography line width, $W_0$, is about 120 nanometers and the height, $H_0$, is about 450 nanometers. In order to make the gate stack line width smaller than 120 nanometers, a PR trimming step must be used to shrink the lateral dimension, $W_0$. Current technologies use plasmas (containing $O_2$, Ar, etc.) to trim/shrink the dimension of PR masks. The two major limitations of the current technologies are 1) the vertical etch rate of the PR is about three times the lateral etch rate, and 2) the vertical etch rate of the (PR) is about equal the vertical etch rate of the anti-reflective coating (ARC), and is also approximately equal to the etch rate of the hard mask, i.e., the oxide.

The final width and height of the mask stacks, $W_1$ and $H_1$, are determined by $W_0$ and $H_0$ and the vertical and lateral etch rates of the mask and stack. Currently, the smallest line width fabricated by using the PR trim techniques is about 80–90 nanometers. Two known alternatives to achieve smaller dimensions include the use of e-beam direct writing or x-ray lithography. Line widths approximating 50 nanometers can be achieved with e-beam direct writing but the throughput is too slow for mass production. Many challenges have hindered the wide use of x-ray lithography in the IC industry, such as fabrication of the 1X mask, mask materials, mask reliability, overlay correction capabilities and limitations in throughput enhancement capabilities.

Other objects and advantages of the present invention will become apparent from the following disclosure.

SUMMARY OF INVENTION

Whereas the narrowest linewidth capable of being fabricated by current photoresist trim techniques is about 80–90 nanometers, it is therefore desired to have a photoresist trimming technique capable of fabricating narrower lines. Therefore, an aspect of the present invention provides a method for producing a lithographically printed image having a reduced critical dimension, the method comprising the steps of:

(a) providing a semiconductor substrate optionally having a hardmask defined thereon;

(b) providing an underlayer on the substrate or the optional hardmask wherein the underlayer is substantially free of any element that forms a non-volatile oxide; (Non-limiting examples of elements that form non-volatile oxides include: silicon, boron, phosphorous, germanium, and aluminum.)

(c) providing a PR layer on the underlayer, wherein the PR layer comprises an element that forms a non-volatile oxide, e.g. silicon, boron, phosphorous, germanium, or aluminum (non-limiting examples);

(d) imagewise exposing the PR layer to radiation forming an image in the PR;

(e) transferring the image into the underlayer; and (f) performing a controlled etch and overetch of the underlayer.

Whereas current lateral trim techniques result in an undesired loss in the original height of the resist image, an aspect of the current invention provides means for achieving lateral trim of the final transferred image with substantial retention of the original image height.

An aspect of the current invention is significant retention of a PR layer during the transfer etch into the underlayer.

An aspect of the invention provides a radiation sensitive resist comprising an element that forms a non-volatile oxide, e.g. silicon, boron, phosphorous, germanium, or aluminum (non-limiting examples).

An aspect of the invention provides means of passivating the resist image against etching.

An aspect of the invention provides passivation means by formation of non-volatile oxide species, e.g. $SiO_x$ species (non-limiting example).

Whereas control over the final critical dimension of the resist image is desired, an aspect of the current invention provides means of controlling the image critical dimension.

An aspect of the invention is to provide plasma etching to transfer the resist image into the underlayer.

An aspect of the invention is to provide oxygen as the reactive species.

An aspect of the invention provides a thick (about 0.4 to about 2.0 micron) ARC or underlayer between the substrate surface and the PR layer. Where the composition of the ARC is modified, thin ARC layers approximately 0.05 microns thick may be obtained.

An aspect of the present invention provides the underlayer be substantially free of any element that forms a non-volatile oxide, e.g. silicon, boron, phosphorous, germanium, or aluminum (non-limiting examples).

An aspect of the present invention provides the underlayer is laterally trimmed using plasma-generated, reactive oxygen species.

An aspect of the present invention provides means of controlling the amount of material etched laterally.

An aspect of the present invention provides means for altering the lateral etch rate by admixing a non-reactive diluent gas, such as a noble gas or a reactive gas, such as $SO_2$.

An aspect of the present invention provides means for controlling the lateral etch rate by controlling the plasma processing conditions, e.g. top power, bottom power, ambient pressure, gas flow rates, and temperatures.

An aspect of the present invention provides means for controlling the lateral etch rate by regulating the etch duration.

Whereas it is desired, by using conventional optical lithographic techniques to fabricate semiconductor devices having feature sizes smaller than about 80–90 nanometers, an aspect of the present invention provides means of manufacturing semiconductor devices having reduced critical dimensions using conventional lithography.

An aspect of the present invention provides means for fabricating bilayer resist images having reduced critical dimension.

An aspect of the present invention is the inventive reduced critical dimension bilayer resist image comprising: a semiconductor substrate; an organic layer provided on the substrate; and a photoresist layer provided on the organic layer, wherein the photoresist layer has a first image developed therein, and wherein the organic layer has a second image, of reduced critical dimension and congruent with the first image, developed therein.

An aspect of the present invention provides a method of using the reduced critical dimension bilayer resist image comprising the steps of: (a) providing a substrate; (b) forming a reduced critical dimension bilayer resist image on the substrate; (c) transferring the image into the substrate forming a circuit image; and (d) forming circuit element materials in the circuit image.

An aspect of the present invention provides the semiconductor device fabricated using the inventive reduced critical dimension bilayer resist image.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures. As a matter of lexicographic convenience, the terms "underlayer," "organic underlayer," "anti-reflective coat," and "ARC" are used interchangeably. As a matter of lexicographic convenience, the terms "PR" and "photoresist" are used interchangeably.

The present invention relates to a process for generating a positive bilayer PR image, of reduced critical dimension, on a substrate comprising the steps of: (a) coating a substrate with an organic underlayer; (b) coating the organic underlayer with a top layer comprising a radiation-sensitive acid generator and a polymer having a silicon-containing, acid-cleavable group; (c) imagewise exposing the top layer to radiation; (d) developing the image in the top layer; (e) transferring the image through the organic underlayer down to the substrate; and (f) reducing the critical dimension of the transferred image in the underlayer (lateral trimming).

Figure 1A:
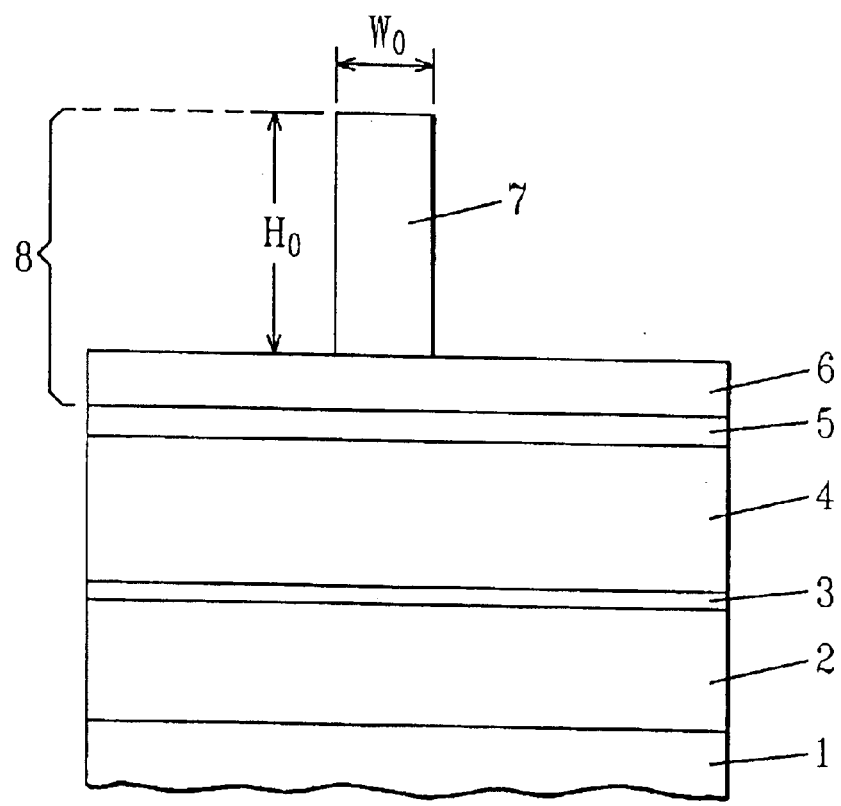
FIG. 1 schematically shows the mask definition technique used to pattern sub-100 nm gates.
Figure 1B:
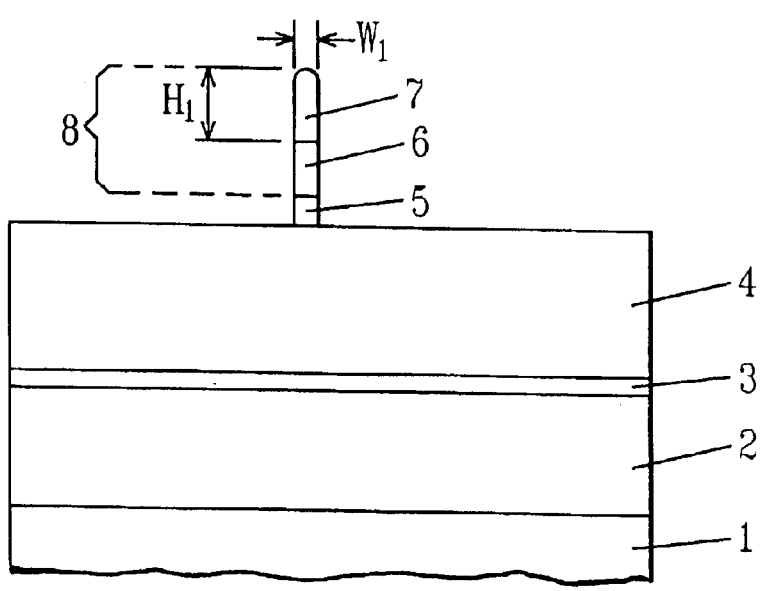
Figure 2A:
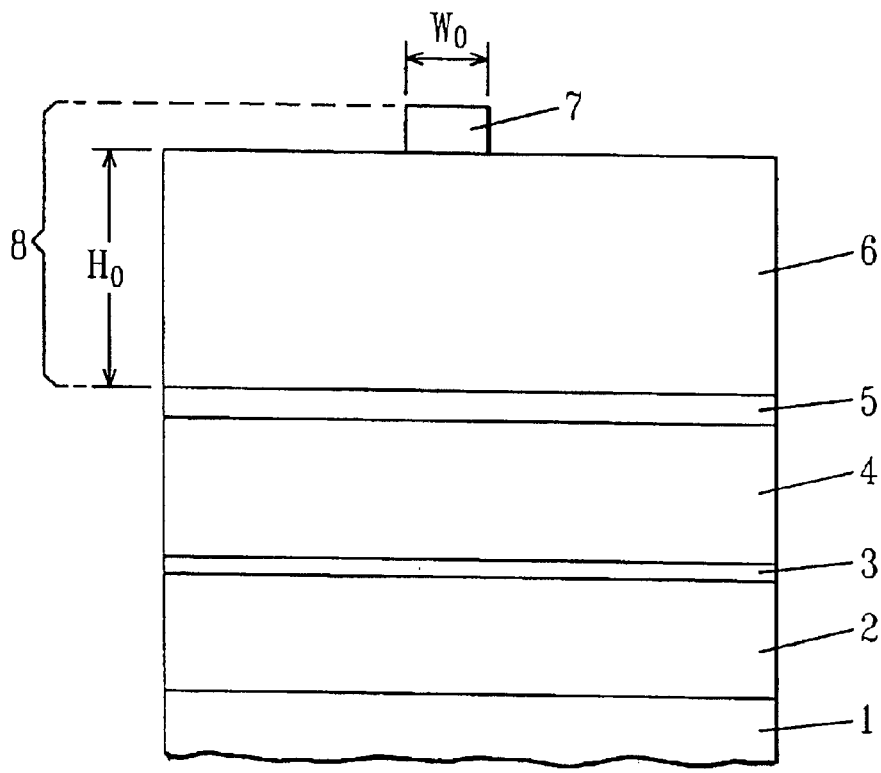
FIG. 2 schematically shows the ability to perform lateral-only PR trimming using bilayer PR masks.
Figure 2B:
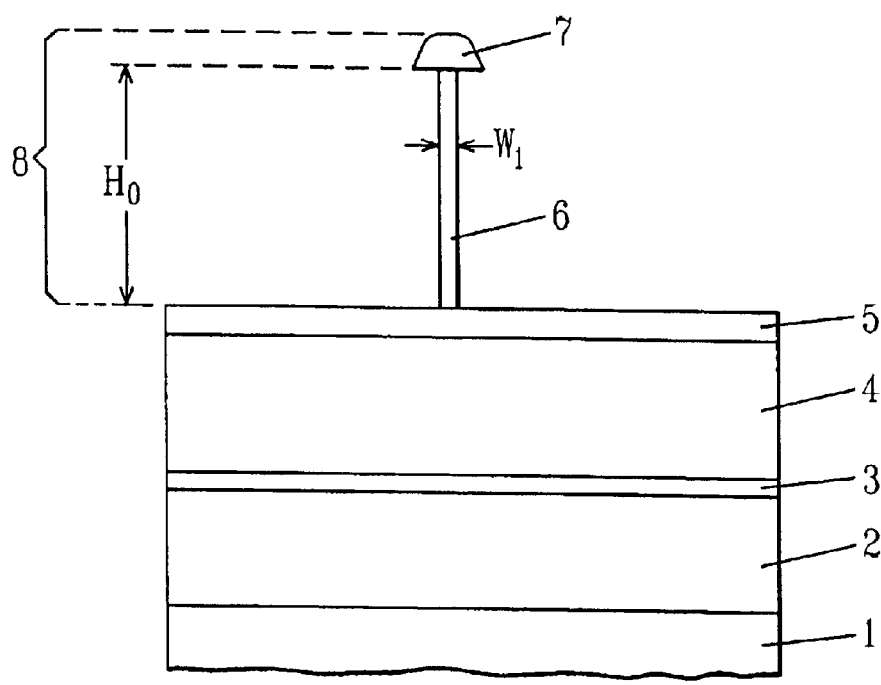

Turning now to FIG. 2, which schematically shows the ability to perform lateral-only PR trimming using bilayer PR masks, the top layer of the bilayer mask 7 is oxidized in the process drastically reducing its vertical etch rate. The lower layer of the bilayer mask 6 reacts with the species produced in the plasma and undergoes the desirable lateral trim. The left and right sides, FIGS. 2A and 2B, show the same structure, respectively, before and after trimming. A semiconductor substrate 1 is provided. In the present example, at least a portion of the front-end-of-the-line (FEOL) fabrication has been performed. The Figure indicates a silicon substrate 2 with gate electrode 3 thereon provided and thereon successive layers of poly gate 4 and hardmask 5.

The first step of the process of the present invention involves coating the substrate with a layer comprising an organic polymer dissolved in a suitable solvent. Suitable substrates include silicon, silicon-germanium (SiGe), gallium arsenide (GaAs), silicon-on-insulator (SOI), and may comprise a stack of films. Suitably, the surface of the substrate is cleaned by standard procedures before the layer is disposed thereon. Suitable solvents for the ARC layer include propylene glycol methyl ether acetate (PGMEA). The layer can be coated on the substrate using art-known techniques such as spin or spray coating, or may be applied by squeegee. The layer is then heated to an elevated temperature of about 100–250° C. for a short period of time of about 1–30 minutes to drive off solvent and optionally to induce thermally-mediated crosslinking. The dried underlayer 6 has a thickness of about 0.4–20 microns, preferably about 0.8 microns.

In a first embodiment of the present invention, a semiconductor wafer, processed through the hardmask, forms the initial input. The hardmask 5 is coated with an underlayer 6 comprising a tuned polymer. The thickness of underlayer 6 should be from about 400 nanometers to about 2000 nanometers and preferably about 800 nanometers. The properties of underlayer 6 should be optimized. The optical properties should include a refractive index (n) at the imaging wavelength of from about 1.7 to about 1.9 The optical properties should include an extinction coefficient (k) of from about 0.20 to 0.22 at the imaging wavelength of 248 nm. The optical properties of tuned polymer 6 should be relatively stable under a variety of processing conditions.

It is desirable that the physical properties of the tuned polymer 6 include an optimized interaction between the polymer layer and top, imaging layer 7. Polymer layer 6 should be strongly adherent to imaging layer 7, but polymer layer 6 should not intermix with imaging layer 7.

Suitable organic, polymeric, planarizing underlayers for the resist of the present invention include epoxies, diamond-like carbon, and novolac. The underlayer comprises the elements C, H, and O. In a preferred embodiment of the invention the tuned polymer is a thermally linked dyed phenolic polymer. Other crosslinkable polymers known to those skilled in the art can also be used as the underlayer. The polymers may be synthesized from monomers selected from the group consisting of acrylate, methacrylate, hydroxystyrene optionally substituted with $C_{1-6}$-alkyl, $C_{5-20}$ cyclic olefin monomers, and combinations thereof, the polymer having acid-cleavable moieties bound thereto, wherein all such moieties are silylethoxy groups optionally substituted on the ethoxy portion thereof with $C_{1-6}$-alkyl, phenyl, or benzyl.

In the second step of the process, the components of the top, imaging layer 7 are dissolved in a suitable solvent such as propylene glycol methyl ether acetate and coated onto the organic polymer underlayer 7. It is desired that the imaging layer 7 not admix with underlayer 6 during the coating process. The top layer has a thickness of about 0.1 to 0.4 micron and preferably about 0.27 micron.

In the next step of the process, the film stack 8, comprising the top imaging layer 7 and underlayer 6 is imagewise exposed to radiation. Suitable radiation includes electromagnetic radiation or electron beam radiation, preferably ultraviolet radiation suitably at a wavelength of about 157–365 nm (157/193/248/254/365/and hard and soft x-ray and euv), more preferably 193 or 248 nm. Preferably, the radiation is substantially monochromatic radiation. Suitable radiation sources include mercury, mercury/xenon, and xenon lamps. The preferred radiation source is an excimer, e.g. ArF, KrF, or $F_2$. At longer wavelengths (e.g., 365 nm) a sensitizer may be added to the top, imaging layer 7 to enhance absorption of the radiation. Conveniently, due to the enhanced radiation sensitivity of the top layer of the resist film, the top layer of the film has a fast photospeed and is fully exposed with less than about 100 mJ/cm$^2$ of radiation, more preferably less than about 50 mJ/cm$^2$. The radiation is absorbed by the radiation-sensitive acid generator or sensitizing agent to generate free acid which causes cleavage of the silicon-containing, acid-cleavable group and formation of the corresponding carboxylic acid or phenol.

Preferably, after the film has been exposed to radiation, the film is again heated to an elevated temperature of about 90–120° C. for a short period of time of about 1 minute.

The next step involves development of an image in the top layer with a suitable solvent. Suitable solvents for development of a high contrast, positive image include an aqueous base, preferably an aqueous base without metal ions such as tetramethyl ammonium hydroxide or choline. The development results in removal of the exposed areas of the top film.

The last step of the process involves transferring of the developed image in the top layer 7, through the underlayer 6, and stopping on substrate 1 by known, reactive ion etching techniques. Reactive ion etching is achieved using a plasma comprised of O, H, F, Cl, and neutral species reactive ion etching techniques are well known in the art and equipment to etch film is commercially available. The developed film has high aspect ratio, high etch resistance, enhanced resolution, and straight wall profiles.

Figure 3:
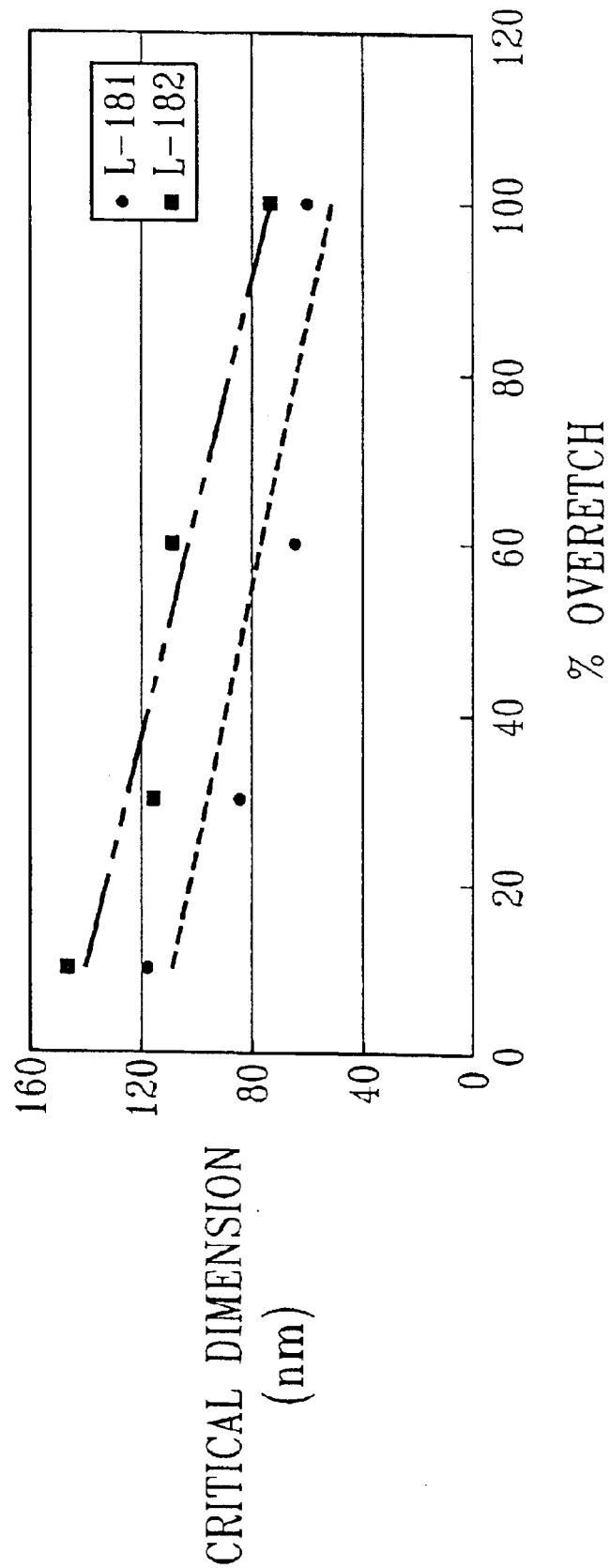
FIG. 3 shows the results obtained from the lateral-only trimming experiments using bilayer resists.
Figure 4A:
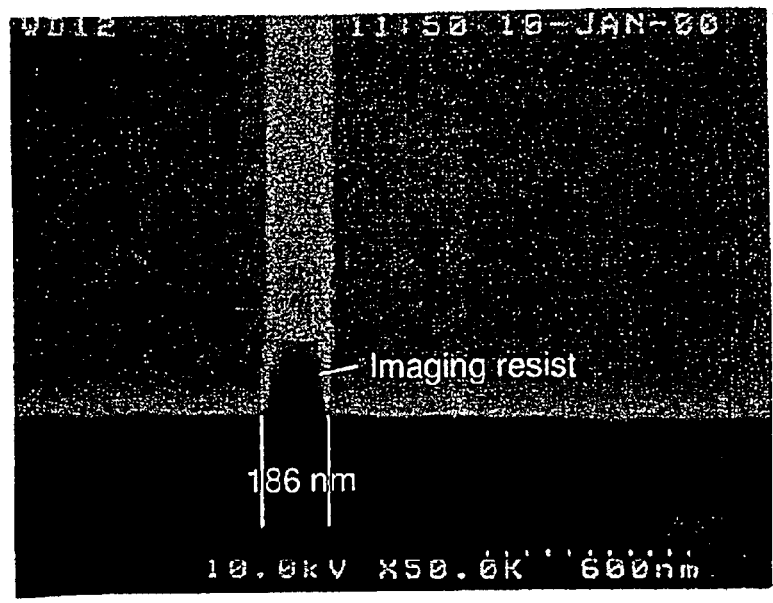
FIG. 4 shows the reduction in critical dimension of an isolated line after it was 60% overetched in an $O_2$ plasma.
Figure 4B:
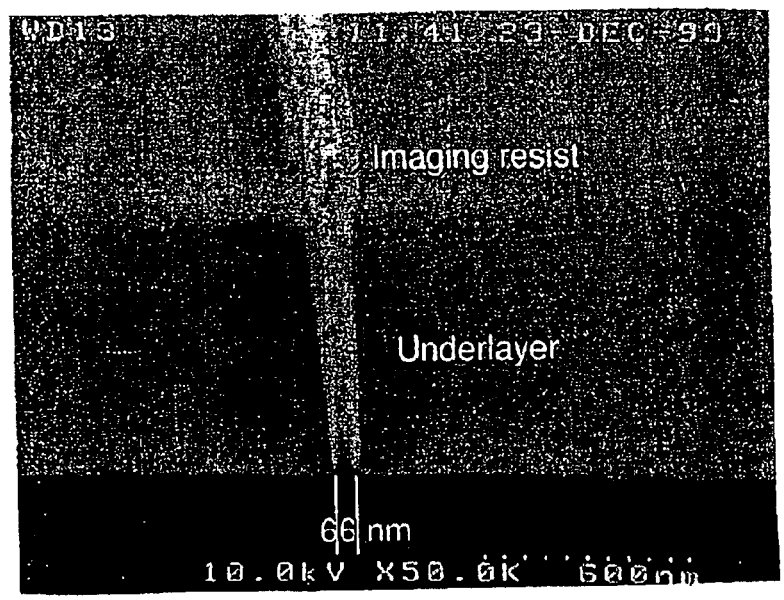

Turning now to FIG. 3, an embodiment of the present invention provides control over the extent to which the lateral trimming proceeds. The variation in CD with respect to etching time for isolated lines with two different widths is shown in FIG. 3. The lines as photo-imaged were 185 nm (L-181) and 220 nm (L-182) before they were transferred into the underlayer. SEM micrographs of the unetched L-181 sample and 60% overetched L-181 sample are shown in FIG. 4 where one can observe the drastic reduction in line-width. At the end of the etch (0% overetch), there is a CD loss which can be determined by extrapolating the dashed lines and subtracting this value from the as-imaged CD. As the patterns were overetched longer, an approximately linear decrease in CD was observed.

The extent of lateral trimming can be controlled by varying the duration of etch. The etch rate may be reduced by dilution of the oxygen plasma with non-reactive gasses such as $N_2$, noble gasses, and other non-reactive gasses as is known in the art. It is known in the art that the etch rate in a plasma ion reactive etch tool may be varied by appropriate control over the RF power, operating pressure, gas flowrate, backside He pressure and electrode and wall temperatures.

The experimental conditions used for the main etch are summarized below. The overetch step involved extending the main etch step beyond the 108 sec. duration. For example, a 50% overetch step lasted 54 seconds making the duration of the entire etch 162 sec.

| Tool: | Lam TCP 9400SE |
| --- | --- |
| TCP power: | 260 W |
| Bias power: | 115 W |
| Pressure: | 2.5 mTorr |
| $O_2$ flow: | 60 sccm |
| Bottom electrode temp.: | −10 C. |
| Duration: | 108 sec. |

The bilayer resist of the present invention may be used to make an integrated circuit assembly, such as an integrated circuit chip, multichip module, circuit board, circuit formed on a substrate by using the process of the present invention, and then additionally forming a circuit in the developed film on the substrate by art-known techniques. After the substrate has been exposed, circuit patterns can be formed in the exposed areas. The surface of the film can be milled to remove any excess conductive material. Dielectric materials may also be deposited by similar means during the process of making circuits. Inorganic ions such as boron, phosphorous, or arsenic can be implanted in the substrate in the process for making p- or n-doped circuit transistors. Other means for forming circuits are well known to those skilled in the art.

It will, therefore, be appreciated by those skilled in the art having the benefit of this disclosure that this invention is capable of producing a resist image having a controllably reduced width while the image substantially retaining its original height. Moreover, it will be appreciated by those skilled in the art having the benefit of this disclosure that a further aspect of the invention provides for the fabrication of semiconductor devices. Illustrative, but not limiting of the types of semiconductor devices that may be produced using the present invention are integrated circuit assemblies, such as an integrated circuit chips, multichip modules, circuit boards, MEMS devices, and thin film magnetic heads.

Although the illustrative embodiments of the invention are drawn from the semiconductor arts, the invention is not intrinsically limited to that art.

Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

What is claimed is:

1. A method for producing a lithographically printed image having a reduced critical dimension, the method comprising:
   providing a semiconductor substrate;
   providing an underlayer on said substrate wherein said underlayer is an optically-optimized polymer substantially free of any element that forms a non-volatile oxide;
   providing a photoresist layer on said underlayer, wherein said photoresist composes a material capable of forming a non-volatile, etch-resistant oxide;
   imagewise exposing said photoresist layer to radiation forming an image in said photoresist;
   transferring said image into said underlayer; and
   performing a controlled overetch of said underlayer;
   etching said underlayer with a plasma; and
   performing a controlled lateral thinning of said underlayer.

2. The method for reducing the critical dimension of a lithographically printed feature, according to claim 1, wherein said underlayer comprises less than 9% silicon.

3. The method for reducing the critical dimension of a lithographically printed feature, according to claim 1, wherein said optically-optimized polymer comprises a polymer having, at an imaging wavelength, a refractive index of from about 1.7 to about 1.9 and an extinction coefficient of from about 0.20 to about 0.22.

4. The method for reducing the critical dimension of a lithographically printed feature, according to claim 1, wherein said underlayer is substantially free of any element that forms a non-volatile oxide wherein said element is selected from the group consisting of silicon, boron, phosphorous, germanium, and aluminum.

5. The method for reducing the critical dimension of a lithographically printed feature, according to claim 1, wherein said photoresist comprises an clement capable of forming a non-volatile, etch-resistant oxide selected from the group consisting of silicon, boron, phosphorous, germanium, and aluminum.

6. The method for reducing the critical dimension of a lithographically printed feature, according to claim 1, wherein the reactive species of said plasma comprises neutrals and ions selected from the group consisting of oxygen, hydrogen, fluorine, and chlorine.

7. The method for reducing the critical dimension of a lithographically printed feature, according to claim 1, wherein said underlayer comprises an optically-optimized polymer comprising carbon, hydrogen, and oxygen.

8. The method for reducing the critical dimension of a lithographically printed feature, according to claim 1, wherein said underlayer comprises an antireflective coating.

9. The method for reducing the critical dimension of a lithographically printed feature, according to claim 1, wherein said photoresist comprises a radiation-sensitive acid generator.

10. The method for reducing the critical dimension of a lithographically printed feature, according to claim 1, wherein said photoresist comprises a polymer having acid-cleavable moieties bound thereto.

11. The method for reducing the critical dimension of a lithographically printed feature, according to claim 1, wherein said photoresist comprises a polymer formed by polymerizing one or more monomers selected from the group consisting of acrylate, methacrylate, hydroxystyrene optionally substituted with $C_{1-6}$-alkyl, $C_{5-20}$ cyclic olefin monomers, and combinations thereof, the polymer having acid-cleavable moieties bound thereto, wherein all such moieties are silylethoxy groups optionally substituted on the ethoxy portion thereof with $C_{1-6}$-alkyl, phenyl, or benzyl.

12. The method for reducing the critical dimension of a lithographically printed feature, according to claim 1, wherein said radiation comprises ultruviolet radiation or extreme ultraviolet radiation.

13. The method for reducing the critical dimension of a lithographically printed feature, according to claim 1, wherein said radiation comprises x-ray radiation.

14. The method for reducing the critical dimension of a lithographically printed feature, according to claim 1, wherein said photoresist comprises a stable, etch-resistant, non-volatile oxide-forming material selected from the group consisting of silicon, phosphorous, germanium, aluminum, and boron.

15. The method for reducing the critical dimension of a lithographically printed feature, according to claim 1, wherein said optically-optimized polymer comprises an organic polymer selected from the group consisting of phenolic polymers, novolacs, epoxies, and diamond-like carbon.

16. The method for producing a lithographically printed image having a reduced critical dimension, according to claim 1, wherein transferring said image comprises plasma reactive-ion etching.

17. The method for reducing the critical dimension of a lithographically printed feature, according to claim 1, wherein
   said substrate has a hardmask defined thereon, and
   said underlayer is provided on said hardmask.

18. The method for reducing the critical dimension of a lithographically printed feature, according to claim 1, wherein said radiation is selected from the group consisting of electromagnetic radiation, 157–365 nm ultraviolet radiation, euv, electron beam radiation, and hard and soft x-ray radiation.

19. The method for reducing the critical dimension of a lithographically printed feature, according to claim 18, wherein said ultraviolet radiation comprises substantially monochromatic radiation having a wavelength of from about 157 nm to about 365 nm.

20. The method for reducing the critical dimension of a lithographically printed feature, according to claim 18, wherein said ultraviolet radiation comprises substantially monochromatic radiation having a wavelength selected from the group consisting of 157, 193, 248, 254, and 365 nm.

21. The method for reducing the critical dimension of a lithographically printed feature, according to claim 1, wherein said plasma comprises a reactive species selected from the group consisting of oxygen, hydrogen, fluorine, and chlorine.

22. The method for producing a lithographically printed image having a reduced critical dimension, according to claim 21, wherein said reactive species comprise neutrals and ions.

23. The method for producing a lithographically printed image having a reduced critical dimension, according to claim 1, wherein performing controlled overetch comprises controlling the etch rate.

24. The method for producing a lithographically printed image having a reduced critical dimension, according to claim 23, wherein controlling said etch rate comprises adding a non-reactive diluent gas to said plasma.

25. The method for producing a lithographically printed image having a reduced critical dimension, according to claim 24, wherein said non-reactive diluent gas comprises nitrogen and noble gasses.

26. The method for producing a lithographically printed image having a reduced critical dimension, according to claim 23, wherein controlling said etch rate comprises regulating process parameters.

27. The method for producing a lithographically printed image having a reduced critical dimension, according to claim 26, wherein said process parameters consist of variables selected from the group consisting of the duration of etch, the rf power, operating pressure, gas flowrates, backside He pressure, electrode temperature, and wall temperature.

28. The method of using the reduced critical dimension bilayer resist image, according to claim 26 wherein said circuit clement materials comprise materials selected from the group consisting of dielectric, conductor, semiconductor, and doped semiconductor materials.

* * * * *